(12) United States Patent
Huang et al.

(10) Patent No.: US 8,691,629 B2
(45) Date of Patent: Apr. 8, 2014

(54) PACKAGING JIG AND PROCESS FOR SEMICONDUCTOR PACKAGING

(75) Inventors: Chi-Ming Huang, Changhua (TW); Tsung-Ding Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/117,901

(22) Filed: May 27, 2011

(65) Prior Publication Data

US 2012/0302008 A1 Nov. 29, 2012

(51) Int. Cl.
*H01L 21/00* (2006.01)
*H01L 23/00* (2006.01)

(52) U.S. Cl.
CPC ........... *H01L 24/11* (2013.01); *H01L 2933/005* (2013.01)
USPC ..... 438/112; 438/106; 438/111; 257/E21.001

(58) Field of Classification Search
USPC ........... 438/106–128, 460–465; 257/678–733
See application file for complete search history.

(56) References Cited

U.S. PATENT DOCUMENTS

| 5,038,248 | A | * | 8/1991 | Meyer ........................... 361/212 |
| 6,062,459 | A | * | 5/2000 | Sabyeying ...................... 228/4.5 |
| 6,084,308 | A | * | 7/2000 | Kelkar et al. .................. 257/777 |
| 6,111,324 | A | * | 8/2000 | Sheppard et al. ............. 257/787 |
| 6,140,707 | A | * | 10/2000 | Plepys et al. .................. 257/778 |
| 6,436,223 | B1 | * | 8/2002 | Edwards et al. ............... 156/288 |
| 6,528,408 | B2 | * | 3/2003 | Kinsman ........................ 438/613 |
| 6,644,982 | B1 | * | 11/2003 | Ondricek et al. ............... 439/73 |
| 6,770,961 | B2 | * | 8/2004 | Lee ................................ 257/687 |
| 6,933,178 | B1 | * | 8/2005 | Su .................................. 438/126 |
| 7,138,724 | B2 | * | 11/2006 | Grigg et al. ................... 257/782 |
| 7,217,580 | B2 | * | 5/2007 | Ondricek et al. ............... 438/14 |
| 7,256,065 | B1 | * | 8/2007 | Too et al. ....................... 438/106 |
| 7,309,916 | B2 | * | 12/2007 | Kang et al. .................... 257/697 |
| 7,402,893 | B2 | * | 7/2008 | Cruz et al. ..................... 257/660 |
| 7,430,798 | B2 | * | 10/2008 | Koizumi et al. ................ 29/740 |
| 8,017,434 | B2 | * | 9/2011 | Lim et al. ...................... 438/106 |
| 8,143,095 | B2 | * | 3/2012 | Honer ............................ 438/106 |
| 8,143,534 | B2 | * | 3/2012 | Hando et al. .................. 174/263 |
| 2002/0093080 | A1 | * | 7/2002 | Kay ............................... 257/678 |
| 2004/0016939 | A1 | * | 1/2004 | Akiba et al. ................... 257/126 |
| 2007/0032065 | A1 | * | 2/2007 | Porter et al. ................... 438/613 |
| 2007/0269909 | A1 | * | 11/2007 | Ondricek et al. ............... 438/14 |
| 2008/0054490 | A1 | * | 3/2008 | McLellan et al. ............. 257/778 |
| 2011/0020984 | A1 | * | 1/2011 | Munakata et al. ............. 438/113 |
| 2011/0192761 | A1 | * | 8/2011 | Js Hsiao et al. ............... 206/710 |
| 2012/0127689 | A1 | * | 5/2012 | Mclellan et al. .............. 361/820 |
| 2013/0089952 | A1 | * | 4/2013 | Lu et al. ........................ 438/110 |
| 2013/0143361 | A1 | * | 6/2013 | Lin et al. ....................... 438/110 |

* cited by examiner

*Primary Examiner* — Seahvosh Nikmanesh
*Assistant Examiner* — Evren Seven
(74) *Attorney, Agent, or Firm* — Slater & Matsil, L.L.P.

(57) ABSTRACT

An embodiment is a method for semiconductor packaging. The method comprises attaching a chip to a carrier substrate through a first side of a jig, the chip being attached by bumps; applying balls to bond pads on the carrier substrate through a second side of the jig; and simultaneously reflowing the bumps and the balls. According to a further embodiment, a packaging jig comprises a cover, a base, and a connector. The cover has a first window through the cover. The base has a second window through the base. The first window exposes a first surface of a volume intermediate the cover and the base, and the second window exposes a second surface of the volume. The first surface is opposite the volume from the second surface. The connector aligns and couples the cover to the base.

22 Claims, 9 Drawing Sheets

PACKAGING JIG AND PROCESS FOR SEMICONDUCTOR PACKAGING

BACKGROUND

A flip-chip package includes a direct electrical connection of a down-facing (that is, "flipped") semiconductor chip onto a substrate, such as a ceramic substrate or a circuit board, using conductive bumps. Flip-chip technology is quickly replacing older wire bonding technology that uses up-facing chips with conductive wires to connect bond pads on chips to substrates.

Previous processes for flip-chip packaging include multiple steps that could cause problems to a resulting package. One process includes the sequential steps of attaching a die to a substrate, reflowing the connections between the die and substrate, applying a flux clean, dispensing underfill between the substrate and die, curing the underfill, applying a molding, curing the molding, dipping ball grid array (BGA) bond pads in flux, dropping the solder balls on the BGA bond pads, and reflowing the solder balls. These multiple processing steps before the solder ball drop may lead to problems with formed solder balls. For example, the application of heat, moisture, and chemicals in previous steps may result in BGA bond pad contamination and oxidation that cause a missing ball from a BGA bond pad or misalignment of the ball on the BGA bond pad. The application of heat may arise from previous reflowing, baking, and/or curing. Moisture may be caused by a flux clean and/or scan modes of Scanning Acoustic Tomography (C-SAM or T-SAM). Chemicals may come from the flux, flux clean solvent, underfill, and/or molding compound.

The process may cause other problems to the package. For example, delamination of an extra low-k (ELK) dielectric layer in the die may result from the process. Also, underfill delamination may result. Other reliability concerns may arise from the process, such as the formation of cracks in bumps on the die, pre-solder cracking, and chip via burn out.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 3 through 6C are various aspects of a method of using the jig during flip-chip packaging according to an embodiment;

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a manufacturing process for forming a flip-chip package, such as for a flip-chip ball grid array (FcBGA) or flip-chip chip scale package (FcCSP). Other embodiments may also be applied, however, to other packaging processes.

Figure 1A:
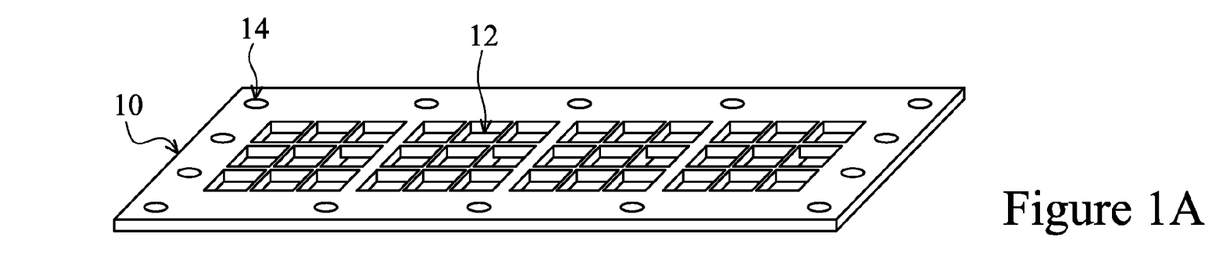
FIGS. 1A through 1C are an expanded view of a jig used during steps of a packaging process according to an embodiment.
Figure 1B:
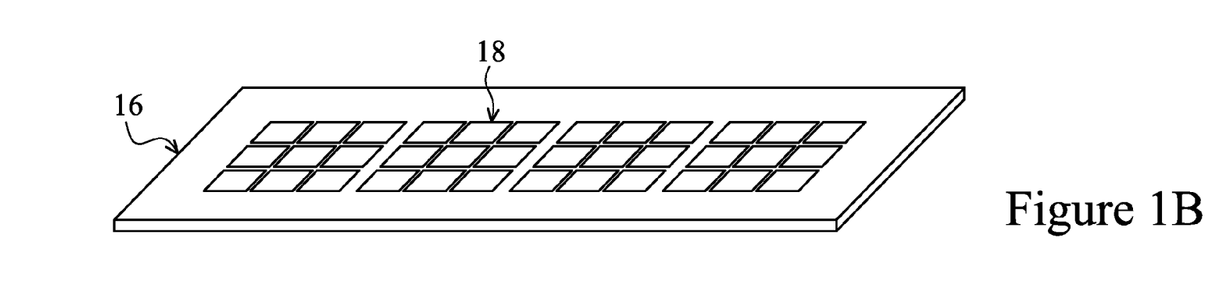
Figure 1C:
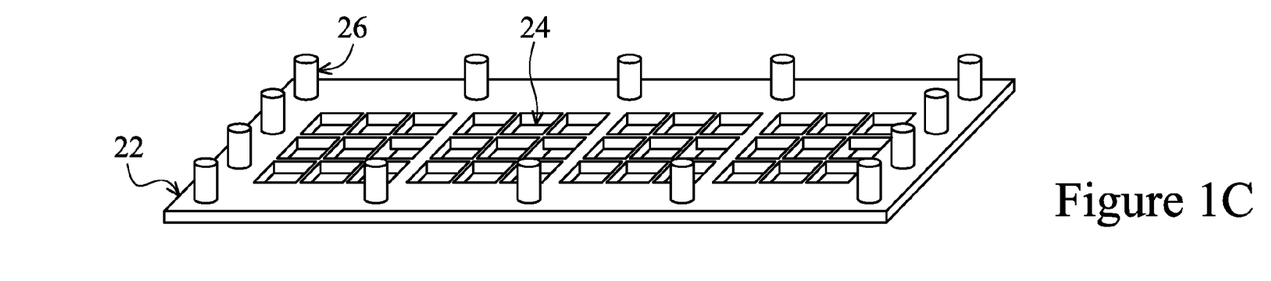

FIGS. 1A through 1C show an expanded view of a jig 30 (see, e.g., FIG. 2A) that holds and stabilizes a carrier substrate 16 during steps of a packaging process. A top cover 10 of the jig 30 is shown in FIG. 1A. The top cover 10 includes windows 12 and apertures 14. FIG. 1B shows the carrier substrate 16 including chip-attach areas 18 and ball grid array (BGA) areas 20 (not shown in FIG. 1B; see FIG. 2C). A bottom base 22 of the jig 30 is shown in FIG. 1C. The bottom base 22 includes windows 24 and guides 26. The apertures 14 and guides 26 are located at corresponding positions along the periphery of the top cover 10 and the bottom base 22, respectively. The apertures 14 receive guides 26 of a bottom base 22 of the jig 30 when assembled. The windows 12 in the top cover 10 are arranged in a manner to expose the chip-attach areas 18 of the carrier substrate 16 when the jig 30 is assembled. The windows 24 are arranged to expose BGA areas 20 of the carrier substrate 16 when the jig 30 is assembled.

Figures 2A, 2B:
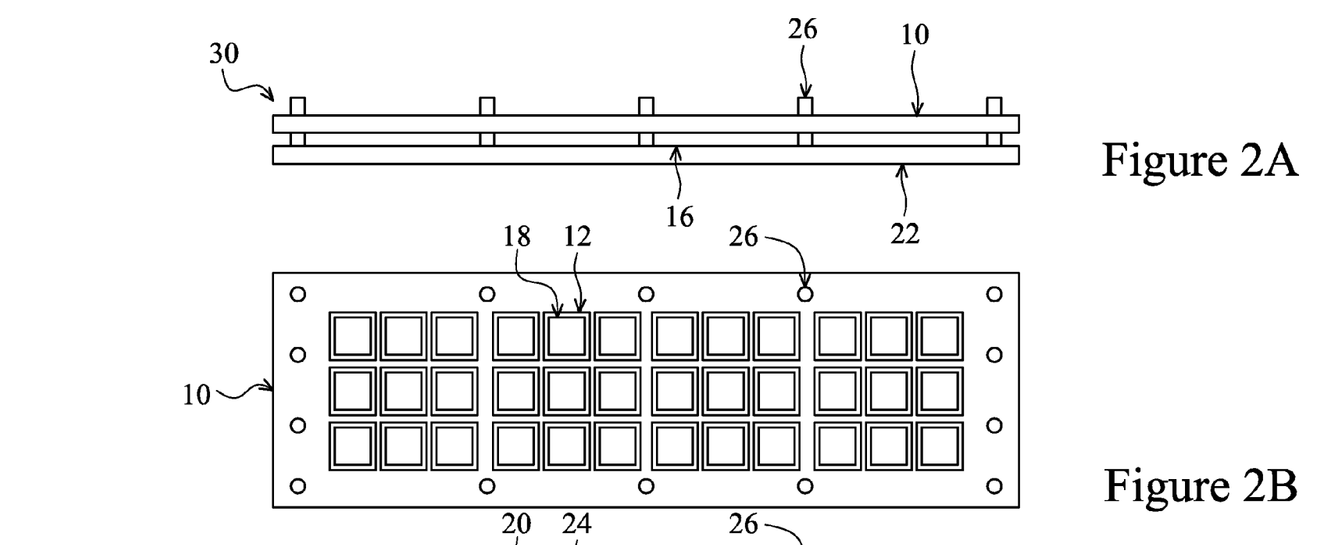
FIGS. 2A through 2C are various views of the assembled jig in FIGS. 1A through 1C according to an embodiment.
Figure 2C:
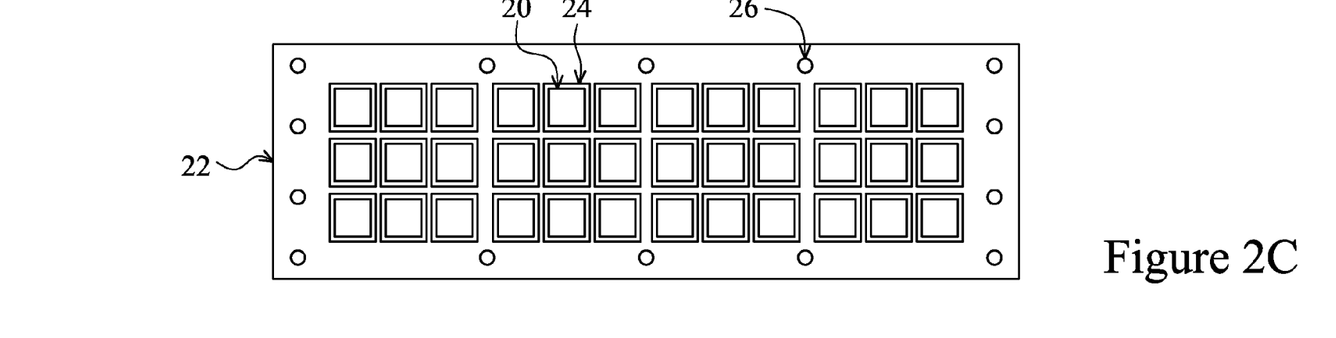

FIGS. 2A through 2C show various views of the assembled jig 30. FIG. 2A is a side view of the jig 30. The jig 30 includes the top cover 10, the bottom base 22 and the carrier substrate 16 intermediate the top cover 10 and the bottom base 22. The guides 26 are inserted into the apertures 14 of the top cover 10 to align the bottom base 22. FIG. 2B is a top view of the jig 30. The chip-attach areas 18 are exposed through the top cover 10 by respective windows 12. FIG. 2C is a bottom view of the jig 30. The BGA areas 20 are exposed through the bottom base 22 by respective windows 24. Further, the windows 12 and 24 may have an area tolerance between the periphery of the area exposed by the windows 12 and 24 and the periphery of the respective chip-attach areas 18 and BGA areas 20. The embodiment depicted in these figures has one area exposed per window. In other embodiments, one window may expose multiple areas, such as multiple chip-attach areas or multiple BGA areas. Further, the top cover and/or the bottom base may be substantially a single frame comprising one window exposing the areas exposed for one side of a carrier substrate. Various combinations of windows for the top cover and the bottom base are contemplated within other embodiments. Although not specifically shown in the figures, one or both of the top cover 10 and the bottom base 22 may have a depression for cradling the carrier substrate 16 into proper alignment when the jig 30 is assembled.

In the present embodiment, the top cover 10 and the bottom base 22 are made of a metal material, such as steel. In this embodiment, magnets may be attached at or on the base of the guides 26 to secure the top cover 10 to the bottom base 22. Magnets may allow for the jig to be securely assembled while still allowing for ease of disassembly. Other embodiments contemplate different materials for the top cover 10 and the bottom base 22 and different components or fasteners for attaching the top cover 10 to the bottom base 22, such as by using screws or bolts and nuts.

The carrier substrate 16 may be any acceptable substrate material, such as an organic or ceramic substrate, and may be formed using any acceptable method. Such a substrate typically includes bump pads, such as in the chip-attach areas 18, to which bumps on an integrated circuit chip are attached. The substrate typically includes an interconnect structure that redistributes and electrically couples the bump pads to ball grid array (BGA) bond pads, such as in the BGA areas 20. Other configurations of a carrier substrate are also contemplated within the scope of other embodiments.

Figure 3:
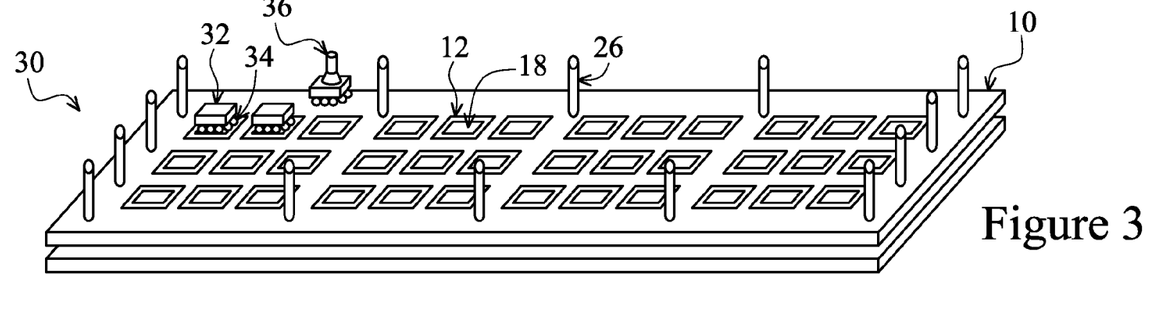

FIGS. 3 through 6C illustrate various aspects of a method of using the jig 30 during flip-chip packaging. In FIG. 3, an assembled jig 30 having a carrier substrate 16 between the top cover 10 and the bottom base 22 (see FIG. 2A) is provided. A chip 32 is attached through a window 12 of the top cover 10 to a chip-attach area 18 of the carrier substrate 16. The chip 32 is mechanically and electrically coupled to the chip-attach area 18 by bumps 34. The bumps 34 may be copper or solder, and may include bumps, pillars, or columns. A tool 36, such as a pick-and-place tool, may be used to attach the chip 32. The chips may be known good dies produced through acceptable semiconductor processing techniques, singulated from a processed wafer, and tested.

Figure 4:
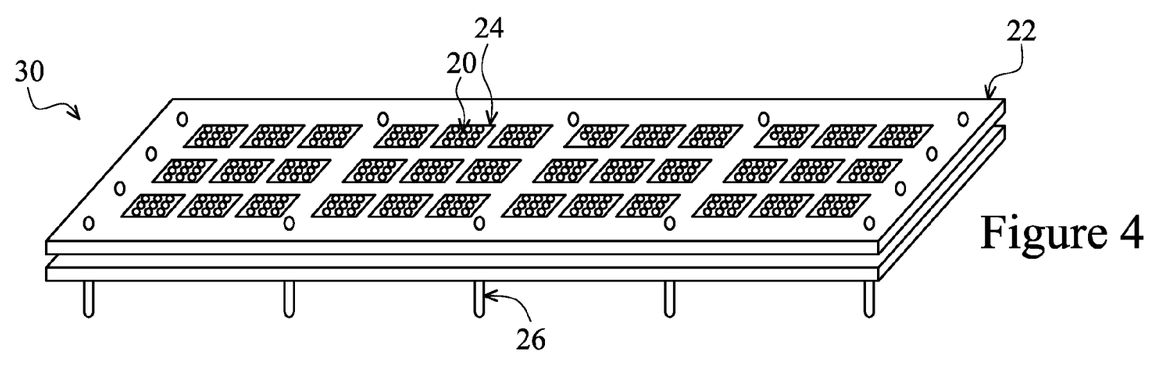

Once chips 32 are attached to the carrier substrate 16, the jig 30 is turned such that the bottom base 22 is facing up, as shown in FIG. 4. Then, with reference to FIGS. 5A, 5B and 5C, flux 46 is applied to bond pads 44 in the BGA areas 20 using a flux dispenser 40 and needles 42. FIG. 5B shows a cross section of a portion 50 of the jig 30 to illustrate the relation of the chip 32, the bumps 34, the BGA bond pads 44, the dispenser 40, and the needles 42. FIG. 5C details the placement of flux 46 on the BGA bond pads 44 in a BGA area 20. With reference to FIGS. 6A, 6B, and 6C, BGA balls 52 are formed on the BGA bond pads 44 in the BGA area 20 exposed by the window 24 in the bottom base 22. FIG. 6B details the portion 50 shown in FIG. 5B with respect to forming the BGA balls 52, and FIG. 6C shows the BGA area 20 with BGA balls 52 formed.

The solder for the bumps 34 and the BGA balls 52 are simultaneously reflowed to more permanently join the bumps 34 and the BGA balls 52 to the carrier substrate 16 and join the bumps 34 to the chip 32. Then, the jig 30 is disassembled, and the carrier substrate 16 with the chips 32 attached is removed from the jig 30. An underfill material, such as an epoxy, is dispensed between the chips 32 and the carrier substrate 16. After curing the underfill, an encapsulant is applied over the chips 32 and the carrier substrate 16, such as a molding compound by compression molding. After the molding is cured, each package comprising a chip 32 is singulated.

Figures 7A, 7B:
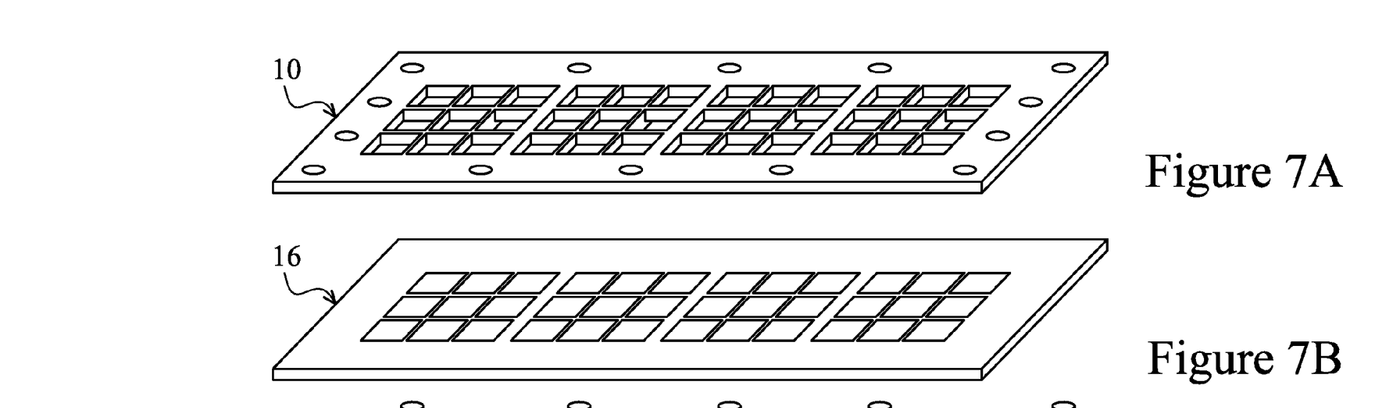
FIGS. 7A through 7D are an expanded view of another jig used during steps of a packaging process according to an embodiment.
Figure 7C:
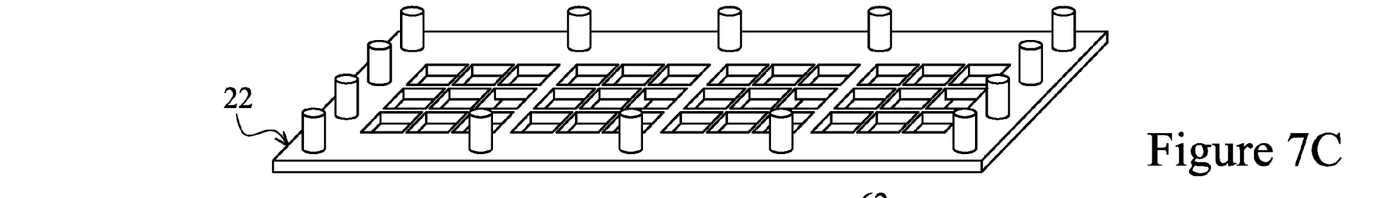
Figure 7D:
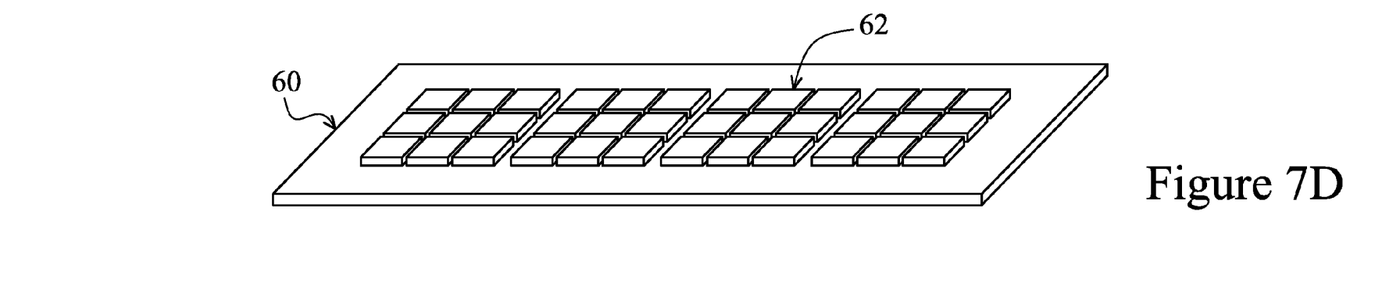

FIGS. 7A through 7D show an expanded view of a jig 70 (see, e.g., FIG. 8A) that holds and stabilizes a carrier substrate 16 during steps of a packaging process. FIGS. 7A through 7C are the same as FIGS. 1A through 1C, respectively, and thus, discussion of FIGS. 7A through 7C is omitted here. FIG. 7D shows a substrate support 60. The substrate support 60 comprises spacers 62 typically arranged in a same pattern as the windows 24 of the bottom base, although the spacers may be arranged in other patterns. The spacers 62 generally fit through windows 24 to contact the carrier substrate 16 during some process steps, such as the attachment of chips 32, to provide additional stability to the carrier substrate 16. The substrate support 60 may be rubber or another material, such as a material that absorbs vibrations. The spacers 62 typically will extend to a height above the substrate support 60 a same distance as the distance through the windows 24, such as the thickness of the bottom base 22 through the windows 24. Thus, the substrate support 60 is capable of contacting the carrier substrate 16 in the assembled jig 70. The length and width of the spacers 62 in directions parallel to the top surface of the substrate support 60 may be any amount but generally not more than corresponding dimensions of the windows 24, for example, the width and length are slightly less than corresponding dimensions of the windows 24. Although the spacers 62 are depicted as cuboids, it should also be noted that other embodiments contemplate other general shapes for the spacers, such as cylindrical or hemispherical.

Figure 8A:
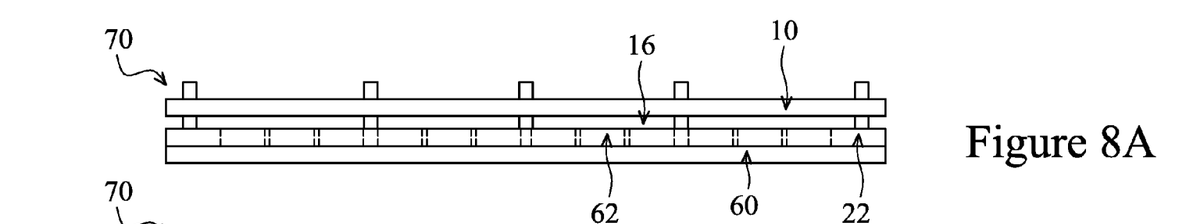
FIGS. 8A through 8C are various views of the assembled jig in FIGS. 7A through 7D according to an embodiment.
Figure 8B:
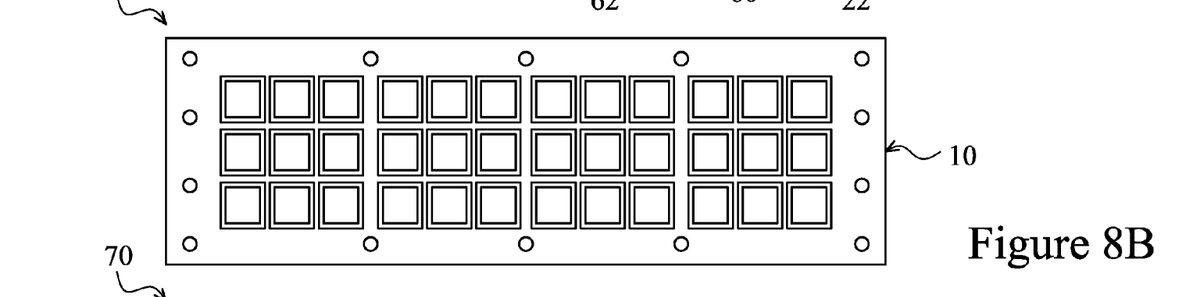
Figure 8C:
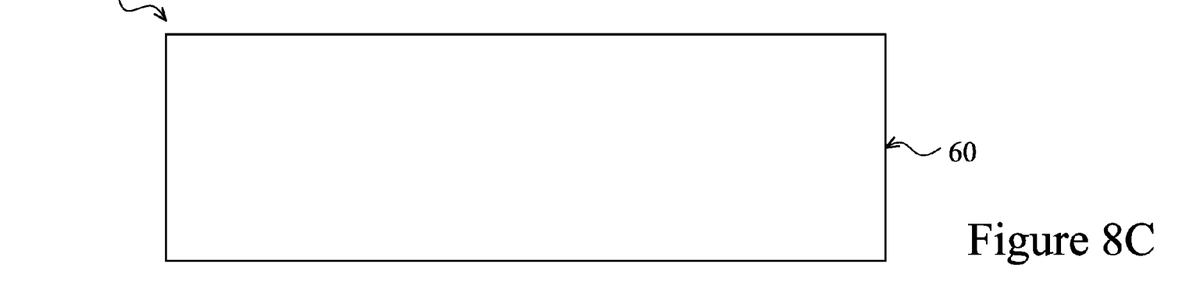

FIGS. 8A through 8C show various views of the assembled jig 70. FIG. 8A is a side view of the jig 70. The jig 70 is generally the same as the jig 30 in FIG. 2A, except the jig 70 includes the substrate support 60. Spacers 62 are shown in phantom as extending through windows 24 of the bottom base 22 to contact and provide support to the carrier substrate 16. FIG. 8B is a top view of the jig 70, which is the same as FIG. 2B. FIG. 2C is a bottom view of the jig 70, which shows the substrate support 60.

Figure 9:
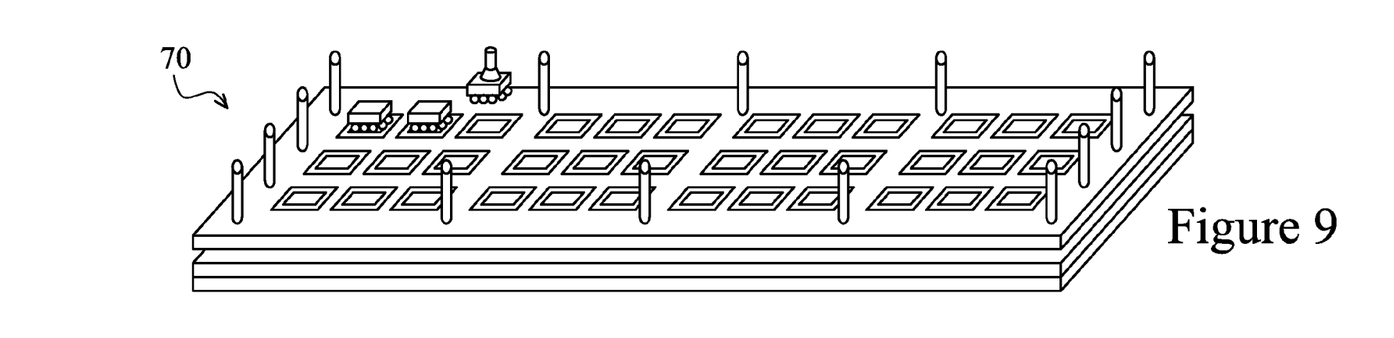
FIGS. 9 and 10 are various aspects of a method of using the jig in FIGS. 8A through 8C during flip-chip packaging according to an embodiment.
Figure 10:
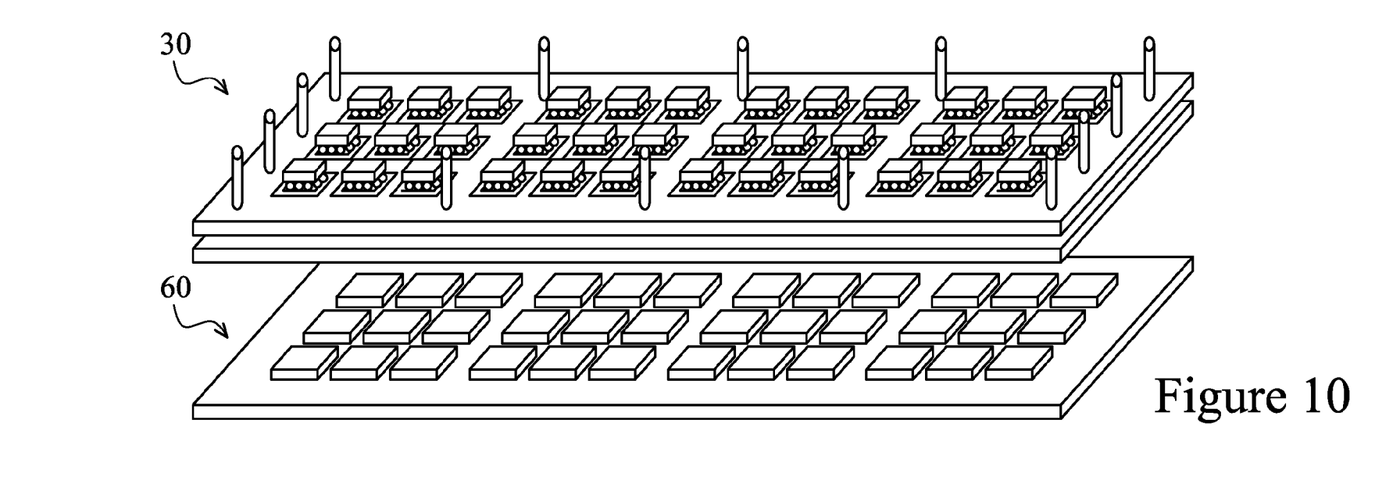

FIGS. 9 and 10 illustrate various aspects of another embodiment of a method of using the jig 70 during flip-chip packaging. Similar to FIG. 3, an assembled jig 70 having a carrier substrate 16, top cover 10, the bottom base 22, and substrate support 60 (see FIG. 8A) is provided. A chip 32 is attached through a window 12 of the top cover 10 to a chip-attach area 18 of the carrier substrate 16. Once chips 32 are attached to the carrier substrate 16, the substrate support 60 is removed, as shown in FIG. 10, resulting in the jig 30 as previously discussed. Subsequent processing may be performed the same as or similar to that discussed with respect to FIGS. 4 through 6C.

Figure 11:
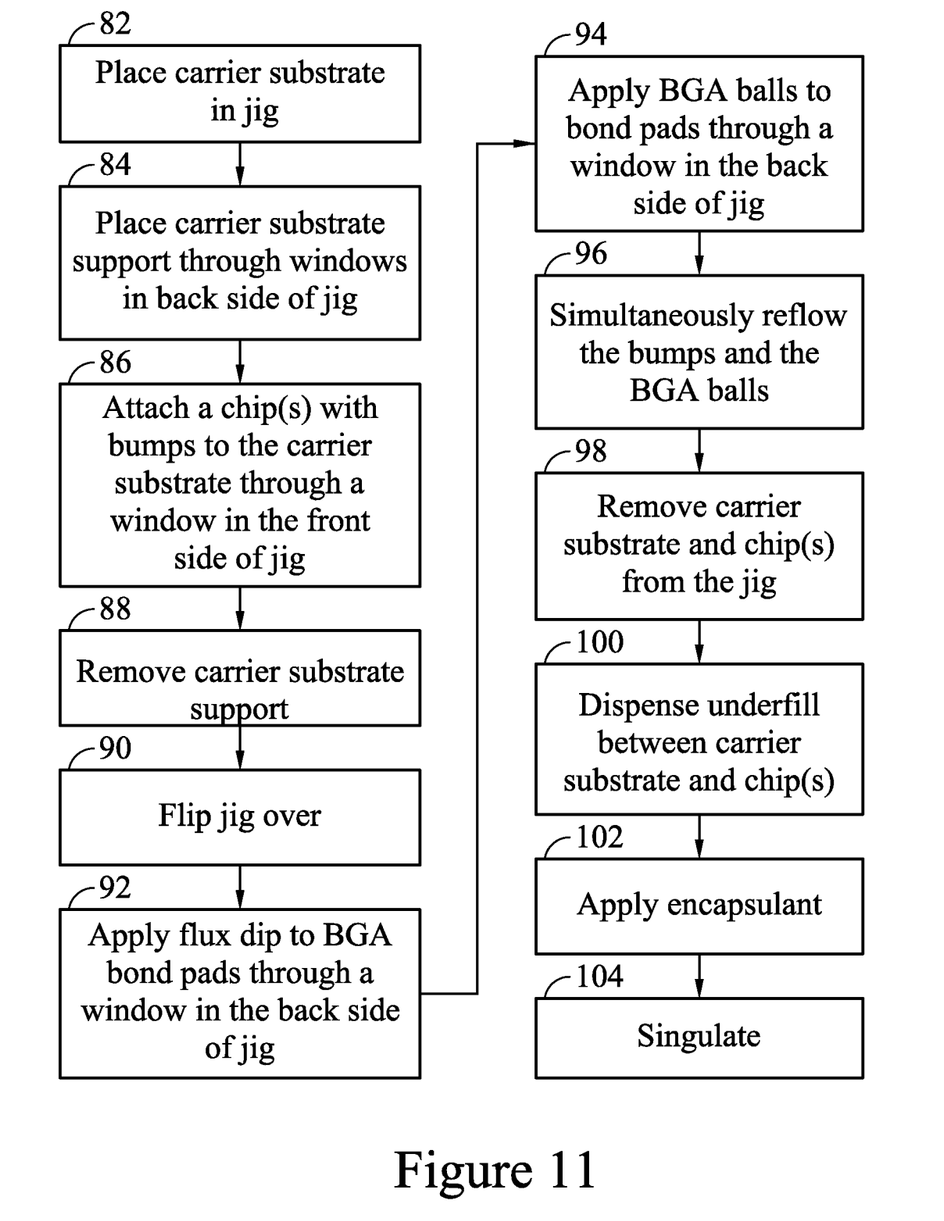
FIG. 11 is a flow chart of a packaging process according to an embodiment.

FIG. 11 outlines a packaging process according to an embodiment. In step 82, a carrier substrate is placed in a jig, such as carrier substrate 16 in assembled jig 30 or 70 in FIG. 2A or 8A. If a carrier substrate support is to be used, in step 84, a carrier substrate support is placed through windows in a back side of the jig, such as placing spacers 62 of substrate support 60 through the windows 24 of the bottom base 22 in FIG. 8A. In step 86, chips with bumps are attached to the carrier substrate through a window in the front side of the jig, such as attaching chips 32 with bumps 34 through windows 12 of the top cover 10 of the jig 30 or 70, as shown in FIG. 3 or 9. If the carrier substrate support is being used, in step 88, the carrier substrate support is removed, such as removing substrate support 60 in FIG. 10. In step 90, the jig is flipped over such that the back side is facing up, such as the bottom base 22 is facing up, as shown in FIG. 4.

Figure 5A:
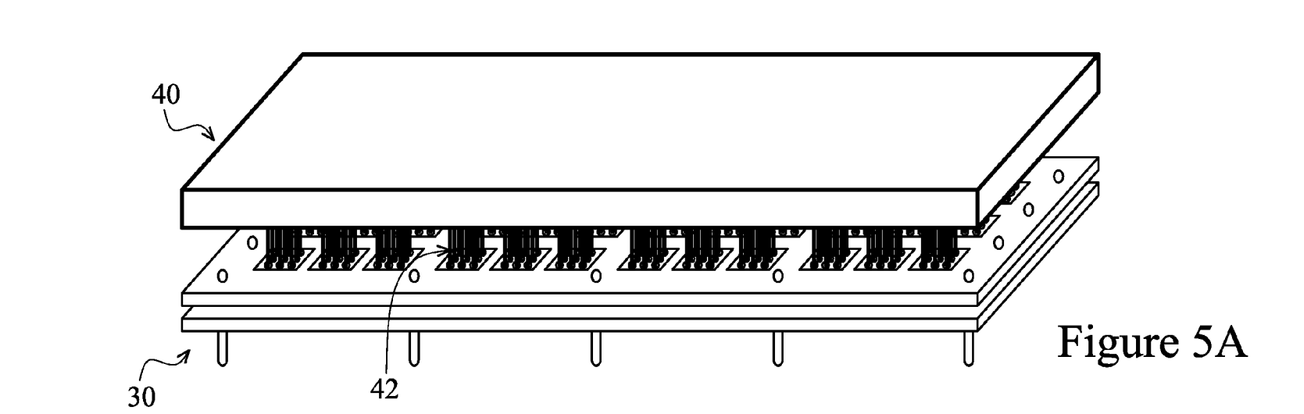
Figure 5B:
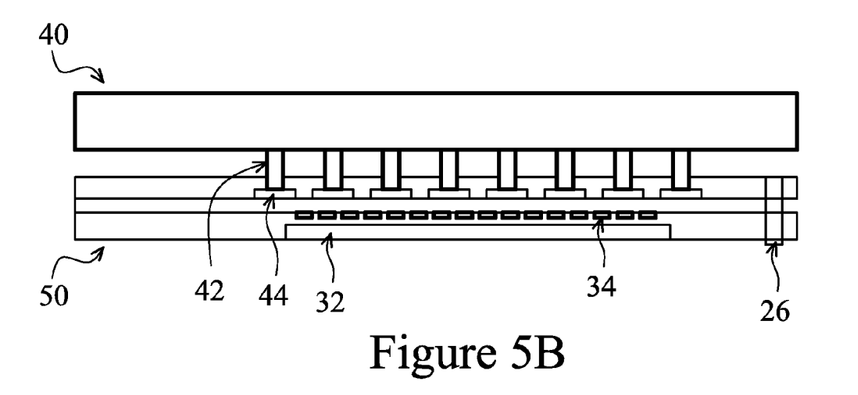
Figure 5C:
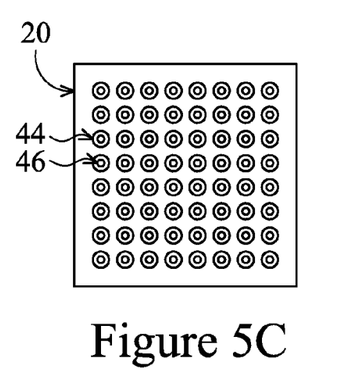
Figure 6A:
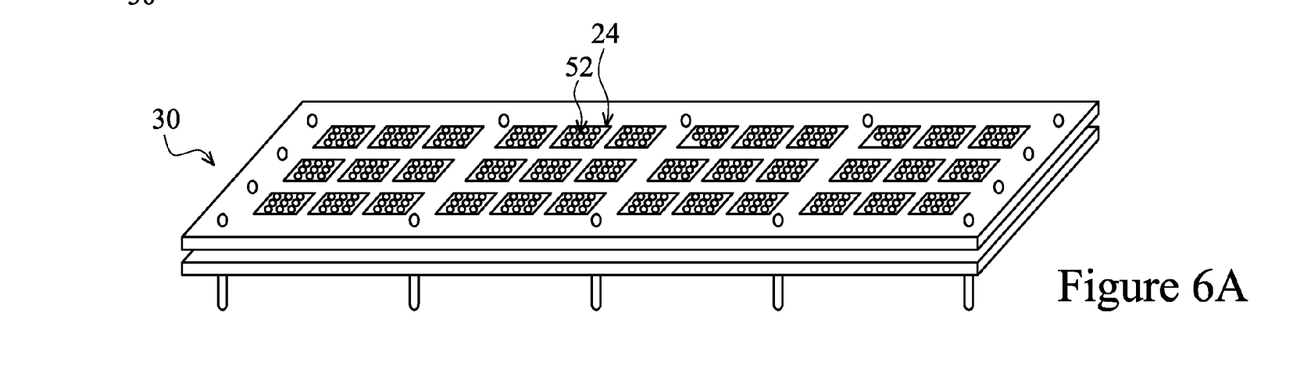
Figure 6B:
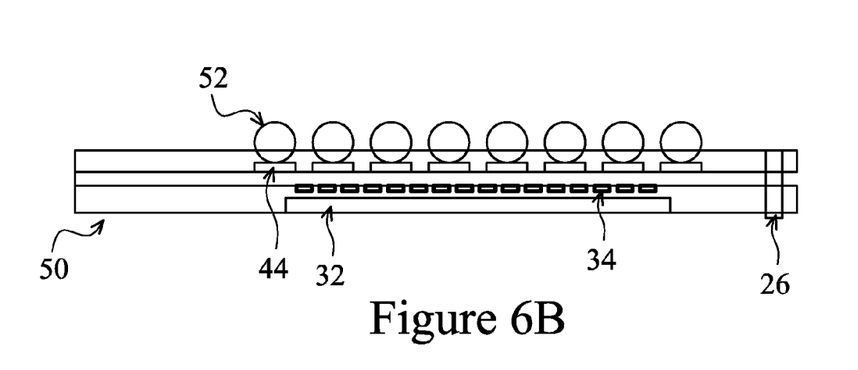
Figure 6C:
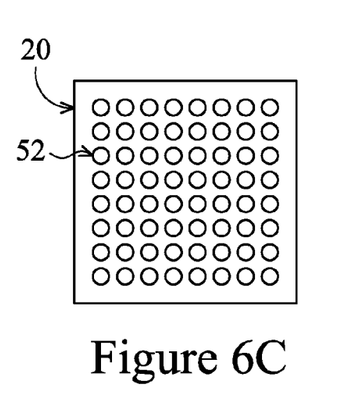

In step 92, a flux dip is applied to BGA bond pads through a window in the back side of the jig, such as applying flux 46 to bond pads 44 in the BGA areas 20 through windows 24 of the bottom base 22 using a flux dispenser 40 and needles 42 shown in FIGS. 5A through 5C. In step 94, BGA balls are applied to bond pads through a window in the back side of the jig, such as forming BGA balls 52 on the BGA bond pads 44 in the BGA area 20 exposed by the window 24 in the bottom base 22, as shown in FIGS. 6A through 6C. In step 96, the bumps on the chips and the BGA balls are simultaneously reflowed, such as simultaneously reflowing bumps 34 on chips 32 and BGA balls 52. In step 98, the carrier substrate and attached chips are removed from the jig, such as removing the carrier substrate 16 with attached chips 32 from the top cover 10 and the bottom base 22. In step 100, an underfill is dispensed between the carrier substrate and the attached chips, such as between the carrier substrate 16 and the chips 32. In step 102, an encapsulant is applied to the carrier substrate and attached chips, such as applying a molding compound using compression molding. In step 104, the carrier substrate and chips are singulated into individual packages.

Embodiments may reduce a packaging process cycle time and reduce yield loss compared to previous packaging processes. For example, using a jig and process described above, a cycle time may be reduced by one to two days, or possibly more. This may also result in reducing equipment costs by obviating a need for all but one reflow machine. Further, by using a simultaneous reflow for the bumps and BGA balls, some damage to the chips and/or packages may be avoided thereby increasing a yield. For example, the simultaneous reflow process may result in similar bumps and balls as previous methods, but delamination of an extra low-k (ELK) dielectric layer on a chip, underfill delamination, bump cracking, pre-solder cracking, and chip via burn out may be avoided by reducing the number of reflow steps used and/or application of, e.g., underfill after the reflow. Further, oxidation and contamination of BGA bond pads may be avoided by avoiding multiple process steps before applying the BGA balls.

An embodiment is a method for semiconductor packaging. The method comprises attaching a chip to a carrier substrate through a first side of a jig, the chip being attached by bumps; applying balls to bond pads on the carrier substrate through a second side of the jig; and reflowing the bumps and the balls.

Another embodiment is a method for semiconductor packaging. The method comprises coupling a chip to a carrier substrate using bumps, the coupling being performed through a first window in a cover of a jig; applying balls to bond pads on the carrier substrate, the applying being performed through a second window in a base of the jig, the base of the jig being opposite the carrier substrate from the cover of the jig; and reflowing the bumps and the balls.

According to a further embodiment, a packaging jig comprises a cover, a base, and a connector. The cover has a first window through the cover. The base has a second window through the base. The first window exposes a first surface of a volume intermediate the cover and the base, and the second window exposes a second surface of the volume. The first surface is opposite the volume from the second surface. The connector aligns and couples the cover to the base.

Although the present embodiments and their advantages have been described in detail, it should be understood that various changes, substitutions and alterations can be made herein without departing from the spirit and scope of the disclosure as defined by the appended claims. For example, the steps of processes and methods disclosed herein may be performed in any logical order and not just the order discussed. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for semiconductor packaging, the method comprising:
   attaching a chip to a carrier substrate through a first side of a jig, the chip being attached by bumps;
   applying balls to bond pads on the carrier substrate through a second side of the jig;
   reflowing the bumps and the balls;
   encapsulating the chip after the reflowing the bumps and the balls; and
   removing the carrier substrate from the jig after the reflowing the bumps and the balls and before the encapsulating the chip.

2. The method of claim 1 further comprising placing a substrate support through the second side of the jig, the substrate support being placed through the second side during the attaching the chip to the carrier substrate.

3. The method of claim 2, wherein the substrate support comprises rubber.

4. The method of claim 1 further comprising:
   placing the carrier substrate between the first side of the jig and the second side of the jig; and
   securing the first side of the jig to the second side of the jig.

5. The method of claim 4, wherein the securing comprises using magnets.

6. The method of claim 1, wherein the reflowing the bumps and the balls is performed simultaneously.

7. The method of claim 1 further comprising:
   dispensing underfill between the carrier substrate and the chip;
   encapsulating the chip; and
   singulating the carrier substrate.

8. The method of claim 1, wherein:
   the attaching the chip through the first side of the jig is through a first window in the first side of the jig, the first window exposing a chip-attach area of the carrier substrate, and
   the applying balls to the bond pads through the second side of the jig is through a second window in the second side of the jig, the second window exposing an array area comprising the bond pads.

9. A method for semiconductor packaging, the method comprising:
   coupling a chip to a carrier substrate using bumps, the coupling being performed through a first window in a cover of a jig;
   applying balls to bond pads on the carrier substrate, the applying being performed through a second window in a base of the jig, the base of the jig being opposite the carrier substrate from the cover of the jig;
   reflowing the bumps and the balls;
   encapsulating the chip after the reflowing the bumps and the balls; and
   removing the carrier substrate from the jig after the reflowing the bumps and the balls and before the encapsulating the chip.

10. The method of claim 9 further comprising placing a spacer in the second window and contacting the carrier substrate, the spacer being in the second window during the coupling the chip to the carrier substrate.

11. The method of claim 10, wherein the spacer comprises rubber.

12. The method of claim 9 further comprising securing the carrier substrate between the cover of the jig and the base of the jig.

13. The method of claim 12, wherein the securing comprises:
   aligning apertures of the cover with guides of the base;
   receiving the guides in the apertures; and
   using magnets, attracting the cover to the base.

14. The method of claim 9 further comprising flipping the jig, wherein a first exterior surface of the jig on the cover faces a first direction during the coupling the chip to the carrier substrate, the first exterior surface having the first window, and wherein a second exterior surface of the jig on the base faces the first direction during the applying the balls to the bond pads, the second exterior surface having the second window.

15. The method of claim 9 further comprising applying a flux to the bond pads through the second window before the applying the balls.

16. The method of claim 9 further comprising:
applying an underfill between the chip and the carrier substrate;
applying a molding compound encapsulating the chip on the carrier substrate; and
singulating the carrier substrate.

17. A method for semiconductor packaging, the method comprising:
placing a carrier substrate between a first side and a second side of a jig, a first exterior surface of the first side of the jig facing a first direction and a second exterior surface of the second side of the jig facing a second direction, the first direction being opposite the second direction;
connecting a chip to the carrier substrate using bumps through a first window, the first window being in the first side of the jig;
connecting balls to bond pads on the carrier substrate through a second window, the second window being in the second side of the jig;
reflowing the bumps and the balls;
removing the carrier substrate from the jig after the reflowing the bumps and the balls; and
encapsulating the chip after the removing the carrier substrate from the jig.

18. The method of claim 17 further comprising placing a support mechanism through the second window and contacting the carrier substrate prior to connecting the chip to the carrier substrate.

19. The method of claim 17 further comprising applying a flux to the bond pads through the second window before applying the balls.

20. The method of claim 17 further comprising:
singulating the carrier substrate.

21. The method of claim 17, wherein the reflowing the bumps and the balls comprises reflowing the bumps and the balls simultaneously.

22. The method of claim 9, wherein the reflowing the bumps and the balls comprises reflowing the bumps and the balls simultaneously.

* * * * *